United States Patent
Cheng et al.

(10) Patent No.: US 9,653,541 B2
(45) Date of Patent: *May 16, 2017

(54) STRUCTURE AND METHOD TO MAKE STRAINED FINFET WITH IMPROVED JUNCTION CAPACITANCE AND LOW LEAKAGE

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Ali Khakifirooz, Los Altos, CA (US); Darsen D. Lu, Mount Kisco, NY (US); Alexander Reznicek, Troy, NY (US); Kern Rim, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/980,210

(22) Filed: Dec. 28, 2015

(65) Prior Publication Data
US 2016/0133697 A1 May 12, 2016

Related U.S. Application Data

(63) Continuation of application No. 14/202,525, filed on Mar. 10, 2014, now Pat. No. 9,276,113.

(51) Int. Cl.
*H01L 29/06* (2006.01)
*H01L 29/78* (2006.01)
(Continued)

(52) U.S. Cl.
CPC ...... *H01L 29/0638* (2013.01); *H01L 29/0653* (2013.01); *H01L 29/0847* (2013.01);
(Continued)

(58) Field of Classification Search
None
See application file for complete search history.

(56) References Cited

U.S. PATENT DOCUMENTS

| 6,943,407 B2 | 9/2005 | Ouyang et al. |
| 7,718,500 B2 | 5/2010 | Chong et al. |

(Continued)

OTHER PUBLICATIONS

Ang, K., et al., "Beneath-The-Channel Strain-Transfer-Structure (STS) and Embedded Source/Drain Stressors for Strain and Performance Enhancement of Nanoscale MOSFETs", IEEE Symposium on VLSI Technology, Jun. 2007. 2 Pages.

(Continued)

*Primary Examiner* — Asok K Sarkar
(74) *Attorney, Agent, or Firm* — Tutunjian & Bitetto, P.C.; Vazken Alexanian (57) ABSTRACT

A method of forming a semiconductor device that includes forming a gate structure on a fin structure and etching the source and drain region portions of the fin structure to provide a recessed surface. A first semiconductor layer is formed on the recessed surface of the fin structure that is doped to a first conductivity type. A leakage barrier layer is formed on the first semiconductor layer. A second semiconductor layer is formed on the leakage barrier layer. The second semiconductor layer is doped to a second conductivity type.

19 Claims, 9 Drawing Sheets

(51) Int. Cl.
*H01L 29/161* (2006.01)
*H01L 29/66* (2006.01)
*H01L 29/165* (2006.01)
*H01L 29/08* (2006.01)
*H01L 21/02* (2006.01)

(52) U.S. Cl.
CPC .......... *H01L 29/161* (2013.01); *H01L 29/165* (2013.01); *H01L 29/66636* (2013.01); *H01L 29/66795* (2013.01); *H01L 29/785* (2013.01); *H01L 29/7848* (2013.01); *H01L 21/0262* (2013.01); *H01L 21/02532* (2013.01)

(56) References Cited

U.S. PATENT DOCUMENTS

| | | |
|---|---|---|
| 8,338,259 B2 | 12/2012 | Wu et al. |
| 8,377,783 B2 | 2/2013 | Shifren et al. |
| 8,421,162 B2 | 4/2013 | Shifren et al. |
| 9,276,113 B2 * | 3/2016 | Cheng ................ H01L 29/7848 |
| 2011/0180847 A1 | 7/2011 | Ikeda et al. |
| 2013/0126972 A1 | 5/2013 | Wang et al. |
| 2013/0140636 A1 | 6/2013 | Johnson et al. |

OTHER PUBLICATIONS

Yamashita, T., et al., "Sub-25nm FinFET with Advanced Fin Formation and Short Channel Effect Engineering", IEEE Symposium on VLSI Technology, Jun. 2011. p. 14-15.

\* cited by examiner

STRUCTURE AND METHOD TO MAKE STRAINED FINFET WITH IMPROVED JUNCTION CAPACITANCE AND LOW LEAKAGE

BACKGROUND

Technical Field

The present disclosure relates generally to semiconductor fabrication, and more particularly to structures and methods for forming fin field effect transistors (FinFETs).

Description of the Related Art

With the continuing trend towards miniaturization of integrated circuits (ICs), there is a need for transistors to have higher drive currents with increasingly smaller dimensions. FinFET technology is becoming more prevalent as device size continues to shrink.

SUMMARY

In one embodiment, a method of forming a semiconductor device is provided that includes forming a gate structure on a fin structure; and etching the source and drain region portions of the fin structure to provide a recessed surface. A first semiconductor layer is formed on the recessed surface of the fin structure that is doped to a first conductivity type. A leakage barrier layer is formed on the first semiconductor layer. A second semiconductor layer is formed on the leakage barrier layer, wherein the second semiconductor layer is doped to a second conductivity type.

In one embodiment, a method of forming a semiconductor device is provided that includes forming a gate structure on a fin structure; and etching the source and drain region portions of the fin structure to provide a recessed surface. A first semiconductor layer is formed on the recessed surface of the fin structure that is doped to a first conductivity type. A leakage barrier layer is formed on the first semiconductor layer. A second semiconductor layer is formed on the leakage barrier layer, wherein the second semiconductor layer is doped to a second conductivity type. The leakage barrier layer is comprised of a material having a greater hand gap than the first semiconductor layer and the second semiconductor layer.

In another aspect, a semiconductor device is provided that includes a fin structure including a channel region, and a source region and a drain region on opposing sides of the channel region. At least one of the source region and the drain region of the fin structure includes a recessed surface. A layered structure composed of doped semiconductor material is present on the recessed surface of the source region and drain region portions of the fin structure that includes a leakage barrier layer. A gate structure is present on a channel region of the fin structure.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure. e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a fin field effect transistor (FinFET) including a leakage barrier layer in the source and drain regions of the device. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. A "field effect transistor (FET)" is a semiconductor device in which the output current, i.e., source-drain current, is controlled by the voltage applied to a gate structure. A FinFET is a field effect transistor in which at least the channel portion of the field effect transistor is present in a fin structure. The channel is the region underlying the gate structure and between the source and drain region of a semiconductor device that becomes conductive when the semiconductor device is turned on. The drain region is the doped region in semiconductor device located at the end of the channel, in which carriers are flowing out of the transistor through the drain. The source region is a doped region in the semiconductor device, in which majority carriers are flowing into the channel.

It has been determined that carrier mobility in semiconductor devices may be increased by introducing a strain to at least one of the source region, drain region and channel region of the semiconductor device. For example, silicon germanium formed on silicon in the source and drain regions of a semiconductor device provides a compressive stress that increases hole mobility in the channel region of the device. Typically, this provides a performance enhancement for p-type semiconductor devices. Semiconductor materials that provide a tensile strain in the channel region of a semiconductor device can enhance electron mobility, which can provide for a performance enhancement in n-type semiconductor devices.

In order to increase the compressive strain induced in the channel of a p-type FinFET with SiGe embedded source and drain regions it is desirable to recess the source and drain regions to a depth greater that the bottom of the fin channel and fill the recessed region with SiGe. However, if the entire SiGe embedded source and drain regions are doped with a p-type dopant, such as boron, the resulting source and drain junctions will be too deep and degrade short channel characteristics of the FinFET. Alternatively, the bottom portion of the silicon germanium layer, that is formed at a depth greater that the bottom of the fin channel, can be doped with an n-type dopants, such as phosphorus or arsenic, and the upper portion is located at the same level to the fin channel or above can be doped with a p-type dopant so that a shallow source/drain junction that does not degrade the short channel effects of the FinFET is obtained. However, since a p-n junction is formed inside the silicon germanium layer and since silicon germanium has a bandgap smaller than that of silicon, the resulting junction leakage of the source and drain junction will unfavorably increase. In some embodiments, the methods and structures that are disclosed herein provide a finFET including source and drain regions employing silicon germanium containing materials with a barrier layer to reduce the incidence of leakage. The methods and structures of the present disclosure are now discussed with more detail referring to FIGS. 1-9

Figure 1:
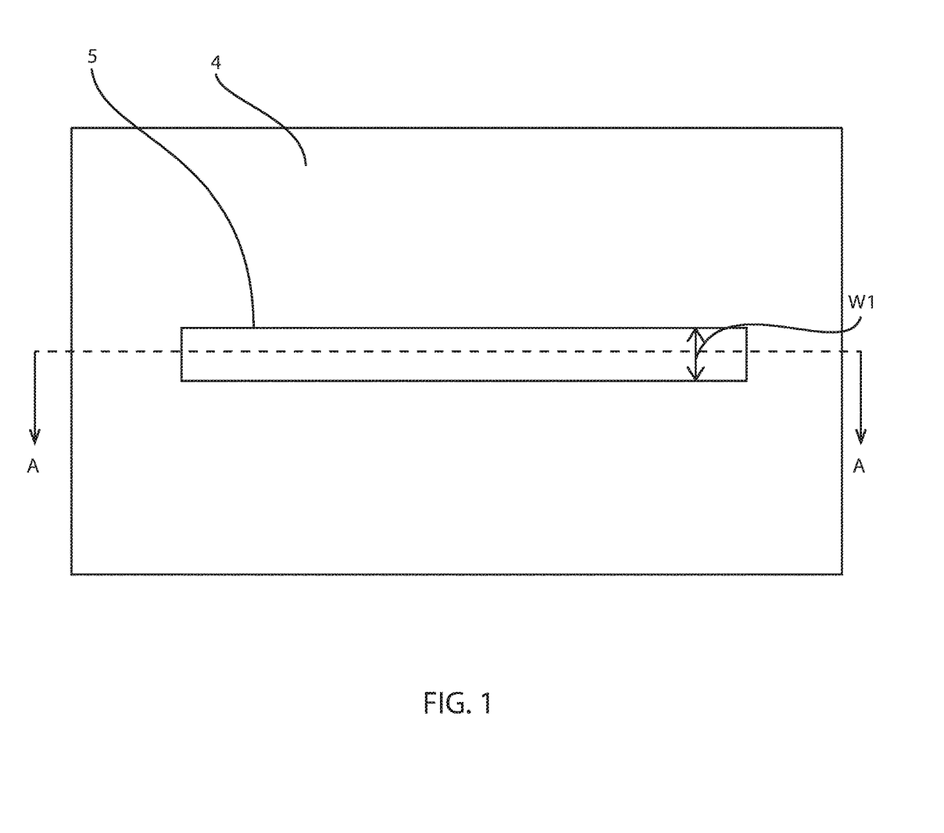
FIG. 1 is a top down view of the fin structure formed on a dielectric surface, in accordance with one embodiment of the present disclosure.
Figure 2:
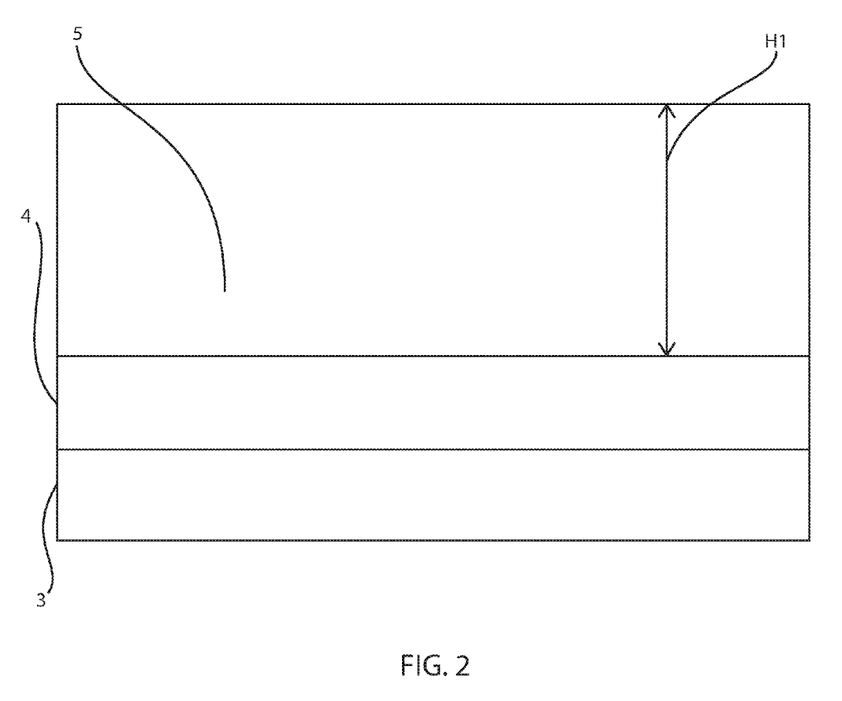
FIG. 2 is a side cross-sectional view of a fin structure along section line A-A (hereafter referred to as a cross-section parallel to a length of the fin structure) that is depicted FIG. 1.

FIGS. 1 and 2 depict one embodiment of a fin structure 5 that is positioned on a dielectric surface 4. The material that provides the fin structure 5 is a silicon-containing material, such as single crystal silicon (Si), monocrystalline silicon (Si), polycrystalline silicon (Si) or a combination thereof. The material of the fin structure 5 may be selected to function in combination with the material of the later formed layered structure in the source and drain region portions of the fin structure 5 to provide a strained channel, such as a tensile strained channel for n-type conductivity devices, such as n-type FinFETs, or a compressive strained channel for p-type conductivity devices, such as p-type FinFETs. The dielectric surface 4 may be a crystalline or non-crystalline oxide, nitride, oxynitride, or any other suitable insulating material.

In some embodiments, the fin structure 5 may be formed from a semiconductor on insulator (SOI) substrate, in which the upper layer of the SOI substrate, i.e., SOI layer, provides the material for the fin structure 5, and the buried dielectric layer of the SOI substrate provides the material for the dielectric surface 4. In some embodiments, in which an SOI substrate is used for forming the fin structure 5 and the dielectric surface 4, a base semiconductor substrate 3 may be present underlying the material layer that provides the dielectric surface 4. The base semiconductor substrate 3 may comprise at least one of Si, Ge, SiGe alloys. SiGe:C, SiC, Si:C. GaAs, InAs, InP, as well as other III/V or II/VI compound semiconductors. The base semiconductor substrate 3 is optional, and may be omitted. In other embodiments, the fin structure 5 and the dielectric surface 4 can be formed using a bulk semiconductor substrate or a dielectric isolated wafer. It is noted that the above description of substrates suitable for forming the fin structure 5 and the dielectric surface 4 are provided for illustrative purposes only, and are not intended to limit the present disclosure. For example, the fin structure 5 and the dielectric surface 4 may be provided by any arrangement that provides a semiconductor material that is present on a dielectric surface 4 so that the semiconductor material may be processed to provide the fin structure 5.

In another embodiment, the fin structures 5 are formed on a bulk substrate with no dielectric layer 4 present under the fin.

The fin structure 5 may be formed using photolithography and etch processes. For example, in some embodiments, prior to etching the semiconductor material layer. e.g., SOI layer of an SOI substrate, that provides the fin structure 5, a layer of the dielectric material is deposited atop the upper surface of the semiconductor material to provide a dielectric fin cap (not shown). The material layer that provides the dielectric fin cap may be composed of a nitride, oxide, oxynitride material, and/or any other suitable dielectric layer. The material layer that provides the dielectric fin cap can be formed by a deposition process, such as chemical vapor deposition (CVD) and/or atomic layer deposition (ALD). Alternatively, the material layer that provides the dielectric fin cap may be formed using a growth process, such as thermal oxidation or thermal nitridation.

In one embodiment, following the formation of the layer of dielectric material that provides the dielectric fin cap, a photolithography and etch process sequence is applied to the material layer for the dielectric fin cap and the material that provides the fin structure 5. Specifically, in one example, a photoresist mask is formed overlying the layer of the dielectric material that provides dielectric fin cap and is present overlying the portion of the semiconductor material layer that provides the fin structure 5. To provide the photoresist mask, a photoresist layer is first positioned on the layer of the dielectric material that provides dielectric fin cap. The photoresist layer may be provided by a blanket layer of photoresist material that is formed utilizing a deposition process such as e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. In some embodiments, etch process that etch the fin structure may also etch the dielectric surface 4.

In some embodiments, fins with spacing less that what is possible by photolithography process are formed by methods such as side-wall image transfer (SIT) or directional self-assembly (DSA), as known in the art.

Following the formation of the photoresist mask, an etching process may remove the unprotected portions of the dielectric material that provides the dielectric fin cap followed by removing the exposed portions of the semiconductor material that provide the fin structure 5 selectively to the photoresist mask and the dielectric surface 4. For example, the transferring of the pattern provided by the photoresist into the underlying structures may include an anisotropic etch, such as reactive ion etch (RIE). In some embodiments, following etching to define the fin structure 5, the dielectric fin cap may be removed by a selective etch.

In an embodiment where the fin structure 5 is directly formed on the substrate 3, an anisotropic etch, such as RIE process, is timed so as to produce the desired fin height. In this case the fin height is typically larger than the portion of the fin that is later surrounded by the gate to form the channel region of the FinFET. A dielectric layer (not shown) is then deposited to cover the fins and the substrate 3 and recessed to reveal a top portion of the fin.

Referring to FIGS. 1 and 2, the fin structure 5 may have a height $H_1$ ranging from 5 nm to 200 nm. In another embodiment, the fin structure 5 has a height $H_1$ ranging from 10 nm to 100 nm. In one example, the fin structure 5 has a height H ranging from 20 nm to 60 nm. The fin structure 5 may have a width $W_1$ of less than 20 nm. In another embodiment, the fin structure 5 has a width $W_1$ ranging from 3 nm to 12 nm. Although a single fin structure 5 is depicted in FIGS. 1 and 2, the present disclosure is not limited to only this example. It is noted that any number of fin structures 5 may be positioned on the dielectric surface 4.

Figure 3:
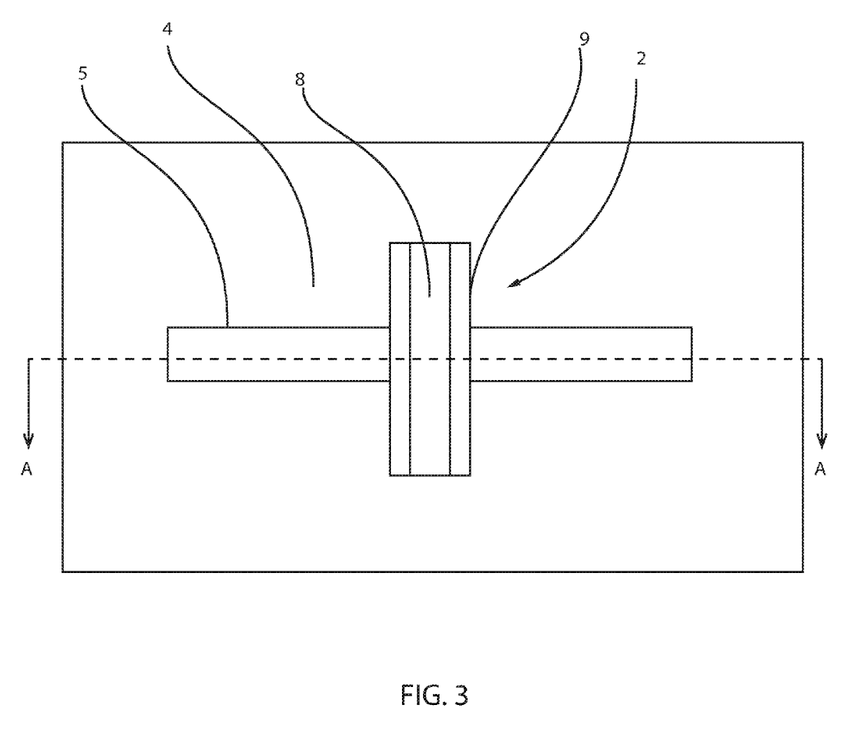
FIG. 3 is a top down view of forming a gate structure on a channel portion of a fin structure, in accordance with one embodiment of the present disclosure.
Figure 4:
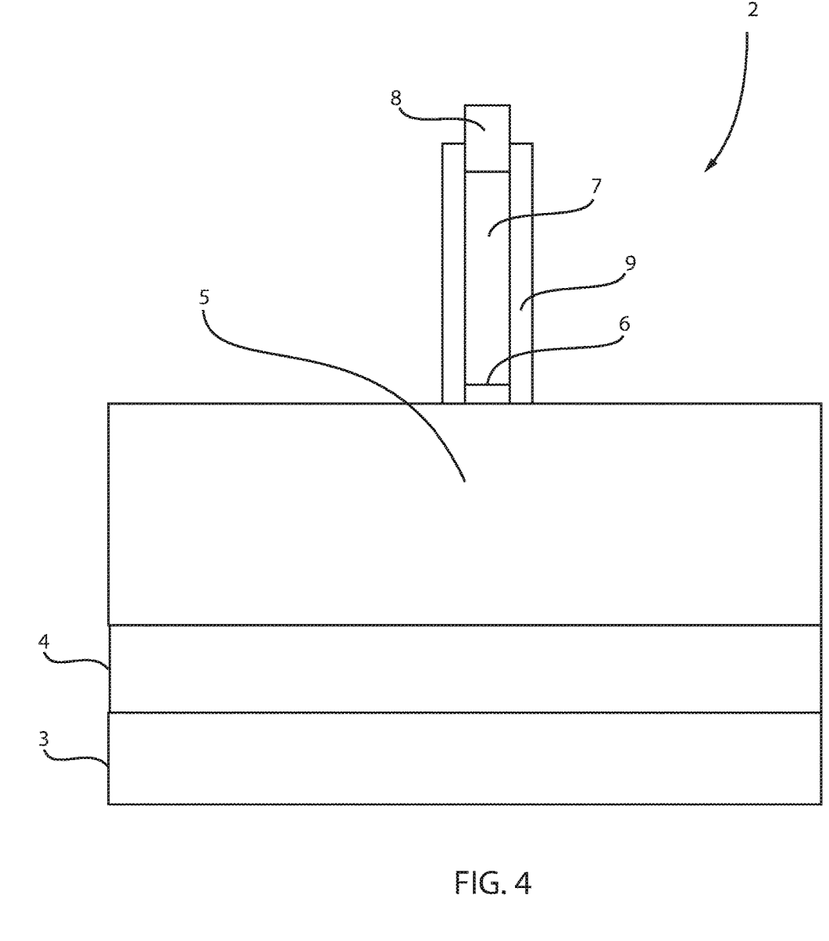
FIG. 4 is a side cross-sectional view of a fin structure along section line A-A of the structure depicted in FIG. 3.

FIGS. 3 and 4 depict one embodiment of forming a gate structure 2 on a channel portion of a fin structure 5. The gate structure 2 functions to switch the semiconductor device from an "on" to "off" state, and vice versa. The gate structure 2 typically includes at least one gate dielectric 6 and at least one gate conductor 7. The at least one gate dielectric 6 is composed of an insulator, and is present around the channel region of the fin structure 5, and the at least one gate conductor 7 is composed of an electrically conductive material and is present on at least one gate dielectric 6. A gate dielectric cap 8 may be present atop the at least one gate conductor 7.

The gate structure 2 may be formed by forming blanket material layers for the at least one gate dielectric 6, the at least one gate conductor 7, and the at least one gate dielectric cap 8 to provide a gate stack, and patterning and etching the gate stack to provide the gate structure 2 utilizing photolithography and etch process steps. The photolithography and etch processes for forming the gate structure 2 is similar to the photolithography and etch processes that have been described above for forming the fin structures.

The at least one gate dielectric 6 is typically positioned on at least a portion of the upper surface and sidewall of the fin structure 5. The at least one gate dielectric 6 may be formed by a thermal growth process such as, e.g., oxidation, nitridation or oxynitridation, or may be formed using a deposition process, such as chemical vapor deposition (CVD). In some embodiments, the at least one gate dielectric 6 is composed of a high-k dielectric material. High-k dielectric materials have a dielectric constant greater than silicon oxide ($SiO_2$) at room temperature, e.g., 25° C. For example, a high-k dielectric composed of hafnium oxide ($HFO_2$), may have a dielectric constant of 16.0 or greater. The physical thickness of the at least one gate dielectric 6 may vary, but typically, the at least one gate dielectric 6 has a thickness ranging from 1 nm to 10 nm.

The at least one gate conductor 7 may be composed of polysilicon, silicon germanium (SiGe), a silicide, a metal or a metal-silicon-nitride, such as Ta—Si—N. Examples of metals that can be used as the at least one gate conductor 7 include, but are not limited to Al, W, Cu, Ti or other like conductive metals. The physical thickness of the at least one gate conductor 7 may range from 5 nm to 100 nm. The gate dielectric cap 8 may be composed of a nitride, oxide, oxynitride material, and/or any other suitable dielectric layer.

A gate sidewall spacer 9 may be formed in direct contact with the sidewall of the at least one gate conductor 7 and the at least one gate dielectric 6. The gate sidewall spacer 9 may be formed using deposition and etch processes. The gate sidewall spacer may 9 be composed of a dielectric material, such as oxides, nitrides or oxynitrides.

In the process flow provided in the supplied figures, the gate structure 2 is formed using a gate first process flow. In a gate first process flow, the gate structure 2 is formed prior to forming the source and drain regions. Although not depicted in the supplied figures, a gate last process flow is equally applicable to the present disclosure. In a gate last process flow, a sacrificial gate structure. i.e., replacement gate structure, is formed prior to forming the source and drain regions, wherein the replacement gate structure defines the geometry of the later formed functional gate structure. In a gate last process flow, following the formation of the source and drain regions, the replacement gate structure is removed, and a functional gate structure is formed in its place.

Figure 5:
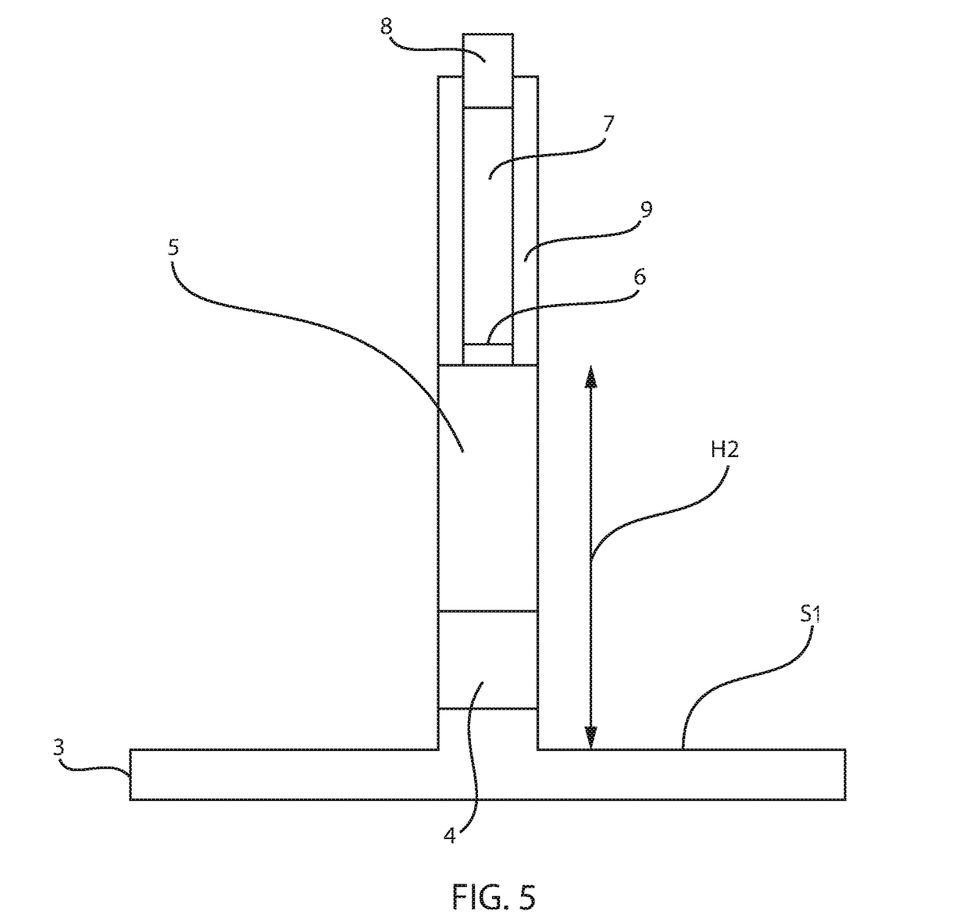
FIG. 5 is a side cross-sectional view (along the cross section that is parallel to the length of the fin structure) depicting etching the source and drain region portions of the fin structure to provide a recessed surface of the fin structure, in accordance with one embodiment of the present disclosure.

FIG. 5 depicts one embodiment of etching the source and drain region portions of the fin structure 5 to provide a recessed surface S1. The recessed surface S1 of the source and drain region portions of the fin structure 5 extend beyond the channel portion of the fin structure 5 that the gate structure 2 is present on. The source and drain region portions of the fin structure 5 may be etched using an etch process that is selective to the gate structure 2. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1. For example, the etch process may remove the exposed silicon material of the fin structure 5 selectively to the silicon nitride material of the gate dielectric cap 8 and the gate sidewall spacer 9.

In some embodiments, the etch process for etching the source and drain region portions of the fin structure 5 is an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiments, the etch process for etching the source and drain region portions of the fin structure 5 is a timed etch.

Typically, the etch process may continue until To a depth greater than the portion of the fin that is gated. In a case where the fin is formed on an SOI substrate, the etch may be continued through the buried insulating layer into the base semiconductor substrate 3.

Figure 6:
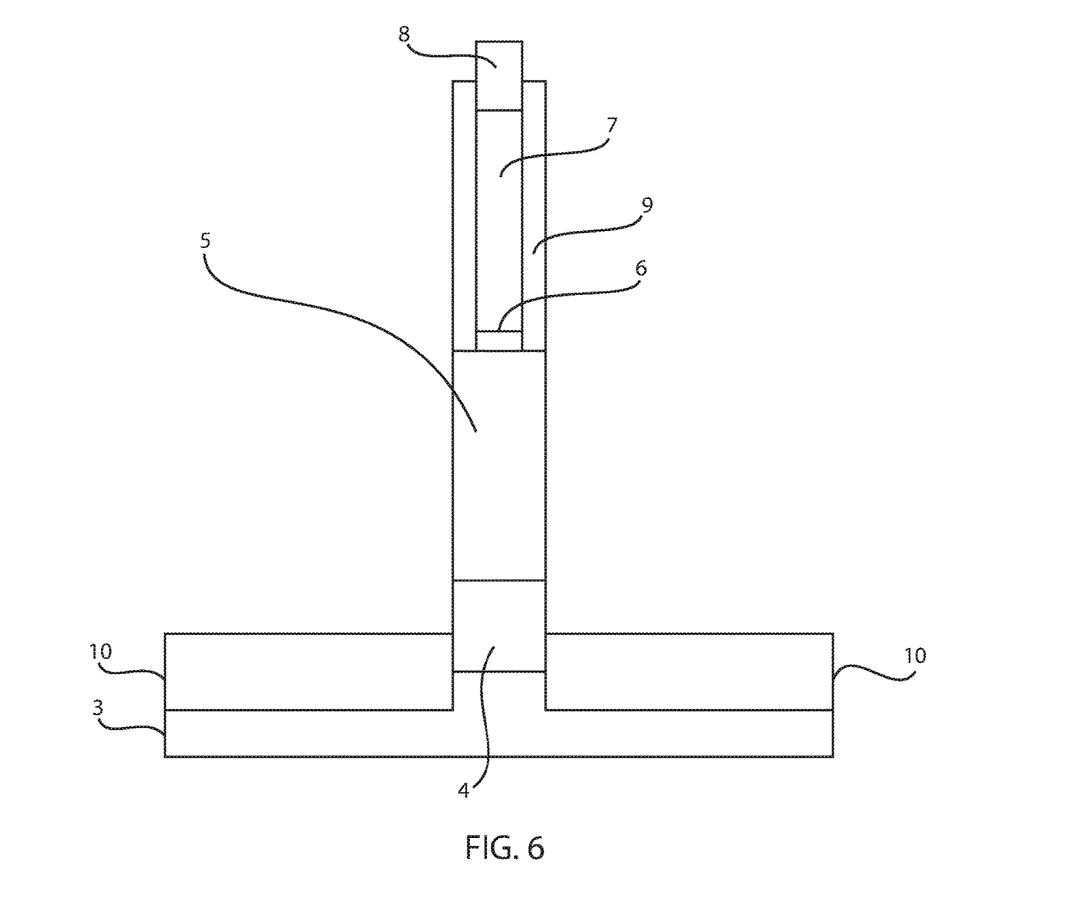
FIG. 6 is a side cross-sectional view depicting forming a first semiconductor layer on the recessed surface of the fin structure depicted in FIG. 5, in which the first semiconductor layer is doped to a first conductivity type, in accordance with one embodiment of the present disclosure.

FIG. 6 depicts one embodiment of forming a first semiconductor layer 10 on the recessed surface S1 of the source region and drain region portions of the fin structure 5. In some embodiments, the material of the first semiconductor layer 10 is selected to induce a strain on the channel region portion of the fin structure 5. In some embodiments, when the fin structure 5 is composed of a silicon containing material, such as single crystal silicon, monocrystalline silicon, or polycrystalline silicon, the material of the first semiconductor layer 10 may be a germanium containing material, such as silicon germanium (SiGe). In some embodiments, the combination of a silicon fin structure 5 and a silicon and germanium containing first semiconductor layer 10 induces a compressive strain on the channel region portion of the fin structure 5 that increases hole mobility and provides a performance enhancement in p-type FinFETs.

In some embodiments, the first semiconductor material 10 may be deposited using an epitaxial deposition process. The term "epitaxial growth and/or deposition" means the growth of a semiconductor material on a deposition surface of a semiconductor material, in which the semiconductor material being grown has the same crystalline characteristics as the semiconductor material of the deposition surface. The term "epitaxial material" denotes a material that is formed using epitaxial growth. In some embodiments, when the chemical reactants are controlled and the system parameters are set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In one embodiment, the first semiconductor material 10 is composed of a germanium-containing material, such as silicon germanium (SiGe). A number of different sources may be used for the deposition of epitaxial silicon germanium. In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The epitaxial deposition process may be carried out in the deposition chamber of a chemical vapor deposition apparatus, such as a plasma enhanced chemical vapor deposition (PECVD) process. The germanium content of the epitaxial layer of silicon germanium may range from 5% to 70%, by atomic weight %. In another embodiment, the germanium content of the epitaxial layer of silicon germanium may range from 10% to 40%.

The first semiconductor layer 10 may have a thickness ranging from 5 nm to 50 nm. In another embodiment, the first semiconductor layer 10 may have a thickness ranging from 10 nm to 20 nm.

The first semiconductor layer 10 may be in situ doped with a first conductivity type dopant. By "in-situ" it is meant that the dopant that dictates the conductivity type of the first semiconductor layer 10 is introduced during the process step, e.g., epitaxial deposition, which forms the first semiconductor layer 10. The term "conductivity type" denotes a p-type or n-type dopant.

The first semiconductor layer 10 may be doped to a conductivity type that is opposite the conductivity type of the later formed second semiconductor layer 12. For example, when the FinFET is a p-type FinFET, the second semiconductor material 12 is doped to a p-type conductivity and the first semiconductor layer 10 is doped to an n-type conductivity. N-type dopants are impurities that contributes free electrons to an intrinsic semiconductor. N-type dopants for type IV semiconductors, such as silicon, typically include elements from group V-A of the Periodic Table of Elements. In a silicon containing fin structure 5, examples of n-type dopants include, but are not limited to, antimony, arsenic and phosphorous. One example of a gas source that provides an n-type conductivity dopant during the epitaxial deposition process that provides the first semiconductor layer 10 is phosphine. The n-type dopant concentration in the first semiconductor layer 10 may range from $10^{17}$ atoms/cm$^3$ to $10^{19}$ atoms/cm$^3$. In another embodiment, the n-type dopant concentration in the first semiconductor layer 10 may range from $10^{18}$ atoms/cm$^3$ to $5 \times 10^1$ atoms/cm$^3$.

In other embodiments, the conductivity type of the first semiconductor layer 10 may be p-type and the conductivity type of the conductivity type of the subsequently formed second semiconductor layer 12 may be n-type to provide an n-type FinFET.

Figure 7:
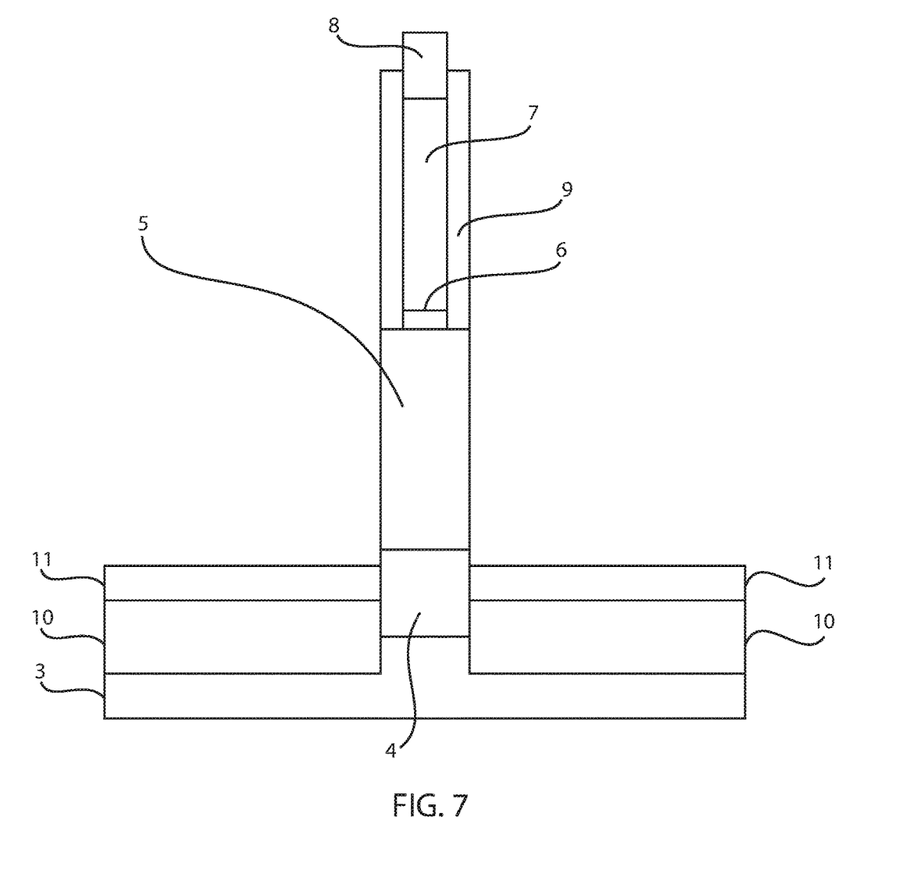
FIG. 7 is a side cross-sectional view depicting forming a leakage barrier layer on the first semiconductor layer that is depicted in FIG. 7, in accordance with one embodiment of the present disclosure.

FIG. 7 depicts forming a leakage barrier layer 11 on the first semiconductor layer 10. The term "leakage barrier layer" denotes a material layer that has a larger bandgap compared to the first semiconductor layer 10. The leakage barrier layer is doped with a dopant polarity opposite to the second semiconductor layer 12 and a doping density so that the depletion region associated with the p-n junction formed between the second semiconductor layer 12 and the leakage barrier layer 11 is fully contained within the leakage barrier layer 11. When an n-type and a p-type semiconductor layer are formed adjacent to each other a p-n junction is formed between the two layers. A depletion region is a portion of the n-type semiconductor layer and a portion of the p-type semiconductor layer that is depleted from the majority carriers of each semiconductor layer; that is depleted from electrons in the n-type semiconductor layer and depleted from holes in the p-type semiconductor layer. With the majority carriers depleted, a net density of ions remain in each side of the p-n junction and throughout the depletion region; positive ions remain on the n-type side of p-n junction and negative ions remain on the p-type side of the p-n junction. The presence of the ions create an electric field across the p-n junction and an electric potential, which is often called the built-in potential of the p-n junction. Since the depletion region is depleted from majority charges, the probability of generation of electron-hole pair inside the depletion region is higher than the probability outside the depletion region. The electrons and holes generated inside the depletion region are swept out of the depleting region, because of the electric field that exists across the p-n junction. This phenomena results in a leakage current across the p-n junction. Furthermore, when the dopant density on each side of the p-n junction is increased, the electric field across the junction increases. If the electric field is high enough, typically more than 1 MV/cm, there is enough band bending across the junction to cause direct tunneling of carriers from the valence band of the p-type semiconductor to the conduction band of the n-type semiconductor, thus resulting in even higher leakage current. Both these leakage mechanisms; i.e., generation and direct tunneling, increase exponentially as the bandgap of the semiconductor materials is reduced. In the absence of the leakage barrier layer 11, the p-n junction is formed directly between the first semiconductor layer 10 and the second semiconductor layer 12. Since both of these semiconductors have band gap smaller than that of Si, the leakage current of the p-n junction is increased. With the leakage barrier layer 11 having larger bandgap compared to the first semiconductor layer 10 and with enough dopant density in the leakage barrier layer 11 to fully contain the depletion region inside the leakage barrier layer 11, the leakage current is significantly reduced.

In one embodiment, the leakage barrier layer 11 is composed of an intrinsic semiconductor material or a lightly doped semiconductor material such that the doping density is less than about $10^{16}$ cm$^{-3}$. When an intrinsic or lightly doped semiconductor 11 in inserted between the first semiconductor layer 10 and second semiconductor layer 12, the intrinsic or lightly doped semiconductor layer 11 is fully depleted of charges and the depletion region of the resulting p-i-n junction extends to the first semiconductor layer 10. So, the presence of the intrinsic or lightly doped layer 11 does not reduce the generation of electron-hole pairs in the depleted portion of the first semiconductor layer 10 and the associated leakage current significantly. However, the maximum electric field at the junction is reduced compared to the case where the first semiconductor layer 10 and second semiconductor layer are in direct contact. Since band-to-band tunneling of a p-n or p-i-n junction is depends exponentially on the electric field across the junction the leakage current produced by band-to-band tunneling is significantly reduced. An intrinsic semiconductor material, also called an undoped semiconductor or i-type semiconductor, is a pure semiconductor without any significant dopant species present. The number of charge carriers is therefore determined by the properties of the material itself instead of the amount of impurities. In intrinsic semiconductors the number of excited electrons and the number of holes are equal: n=p. The material of the intrinsic semiconductor or lightly doped semiconductor may be selected to have a larger bandgap than the underlying semiconductor layer 10 and second semiconductor layer 12 to reduce the leakage in semiconductor devices. For example, when the first and second semiconductor layers 10, 12 are composed of silicon germanium (SiGe), the leakage barrier semiconductor may be silicon (Si), such as single crystal silicon, monocrystalline silicon, polycrystalline silicon or a combination thereof.

The leakage barrier layer 11 may be formed using an epitaxial deposition process. A number of different sources may be used for the deposition of epitaxial silicon (Si). In some embodiments, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. The temperature for epitaxial silicon deposition typically ranges from 250° C. to 900° C. Although higher temperature typically results in faster deposition, the faster deposition may result in crystal defects and film cracking. Similar to the first semiconductor layer 10, the leakage barrier layer 11 may be epitaxially formed in the deposition chamber of a chemical vapor deposition (CVD) apparatus, such as a plasma enhanced chemical vapor deposition (PECVD) apparatus.

In another embodiment, the leakage barrier layer 11 may be include a semiconductor material layer having a graded dopant concentration so that a first conductivity portion, e.g., n-type portion, of the semiconductor material layer is in direct contact with the first conductivity. e.g., n-type conductivity, first semiconductor layer 10, and that a second conductivity portion, e.g., p-type portion, of the semiconductor material layer is in direct contact with a second conductivity, e.g., p-type conductivity, second semiconductor layer 12. The leakage barrier layer 11 having the graded dopant concentration may be formed of epitaxial silicon using an epitaxial deposition method that is similar to the deposition process described above for forming the leakage barrier layer 11 of intrinsic silicon, with the exception that the epitaxial deposition process for forming the graded semiconductor material includes a gas source for in situ doping of n-type and p-type dopants, such as diborane or phosphine. The amount of the dopant gas source for the n-type and p-type dopant is varied during the deposition process in accordance with the grading of the dopant.

For example, in a p-type conductivity finFET, the deposition source gasses for the epitaxial deposition of the graded leakage barrier layer 11 may begin with a high concentration of n-type dopant source gas for deposition at the interface with the first semiconductor layer 10 and a low concentration of p-type dopant source gas at the interface with the first semiconductor layer 10. As the thickness of the graded leakage barrier layer 11 increases, the concentration of the n-type dopant source gas decreases and the concentration of the p-type dopant source gas increases to provide a high concentration of p-type dopant at the interface with the second semiconductor layer 12. N-type dopant may not be present at the interface with the second semiconductor layer 12. The inverse relationship of dopant conductivities within the graded leakage barrier 11 may exist for n-type conductivity finFETs.

The leakage barrier layer 11 may have a thickness ranging from 10 nm to 50 nm. In another embodiment, the leakage barrier layer 11 may have a thickness ranging from 15 nm to 30 nm.

Figure 8:
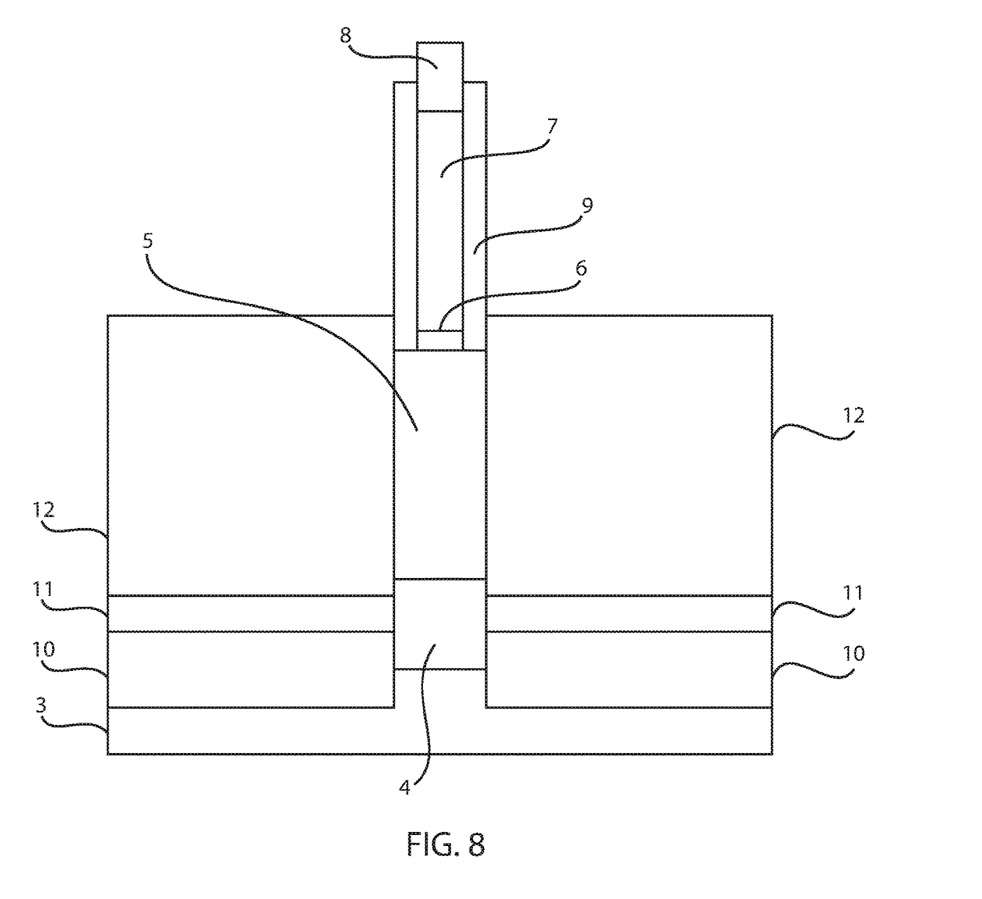
FIG. 8 is a side cross-sectional view depicting forming a second semiconductor layer on the leakage barrier layer that is depicted in FIG. 7, in accordance with one embodiment of the present disclosure.

FIG. 8 depicts one embodiment of forming a second semiconductor layer 12 on the leakage barrier layer 11, wherein the second semiconductor layer 12 has a second conductivity type. For example, when the FinFET is a p-type semiconductor device, e.g., p-type FinFET, the second conductivity type is p-type. In some embodiments, the material of the second semiconductor layer 12 is selected to induce a strain on the channel region portion of the fin structure 5. In some embodiments, when the fin structure 5 is composed of a silicon containing material, such as single crystal silicon, monocrystalline silicon, or polycrystalline silicon, the material of the second semiconductor layer 12 may be a germanium containing material, such as silicon germanium (SiGe). In some embodiments, the combination of a silicon fin structure 5 and a silicon and germanium containing second semiconductor material 12 induces a compressive strain on the channel region portion of the fin structure 5 that increases hole mobility and provides a performance enhancement in p-type FinFETs.

In some embodiments, an epitaxial deposition process may be employed for forming the second semiconductor layer 12. The epitaxial deposition process for forming the second semiconductor layer 12 is similar to the epitaxial deposition process that is described above for forming the first semiconductor layer 10. Therefore, the above description of epitaxial deposition and gas sources for forming the first semiconductor layer 10 that is depicted in FIG. 6 is suitable for the description of forming the base material for the second semiconductor material 12 that is depicted in FIG. 8. The second semiconductor layer 12 may be in situ doped to an opposite conductivity as the first semiconductor layer 10. For example, when the first semiconductor layer 10 is doped to an n-type conductivity, the second semiconductor layer 12 is doped to a p-type conductivity.

The term "p-type" to describe dopants refers to the addition of impurities to an intrinsic semiconductor that creates deficiencies of valence electrons. The p-type conductivity semiconductor devices are typically produced within type IV semiconductors, such as silicon containing materials, by doping the source and drain region portions of the fin structures 5 with elements from group III-A of the Periodic Table of Elements. In a second semiconductor layer 12 that is composed of silicon germanium, examples of p-type dopants, i.e., impurities, include but are not limited to boron, aluminum, gallium and indium. One example of a gas source that can be used to introduce p-type dopants during the epitaxial deposition process that forms the second semiconductor layer 12 is diborane.

The p-type dopant concentration in the second semiconductor layer 12 may range from $5 \times 10^{19}$ atoms/cm$^3$ to $10^{21}$ atoms/cm$^3$. In another embodiment, the p-type dopant concentration in the second semiconductor layer 12 may range from $10^2$ atoms/cm$^3$ to $7 \times 10^{20}$ atoms/cm$^3$.

The second semiconductor layer 12 may have a thickness ranging from 10 nm to 100 nm. In another embodiment, the second semiconductor layer 12 may have a thickness ranging from 20 nm to 50 nm.

The second semiconductor layer 12, the leakage barrier layer 11 and the first semiconductor layer 10 provide the layered structure of the source region portion and the drain region portion of the fin structure 5. The thickness of each of the layers of the second semiconductor layer 12, the leakage barrier layer 11 and the first semiconductor layer 10 may be selected so that an upper surface of the layered structure, i.e., upper surface of the second semiconductor layer 12, in the source and drain region portions of the fin structure 5 is substantially coplanar with an upper surface of the channel region portion 13 of the fin structure 5. In some embodiments, the thickness of each of the layers of the second semiconductor layer 12, the leakage barrier layer 11 and the first semiconductor layer 10 may be selected so that an upper surface of the layered structure, i.e., upper surface of the second semiconductor layer 12, in the source and drain region portions of the fin structure 5 is slightly higher or lower than an upper surface of the channel region portion 13 of the fin structure 5.

Figure 9:
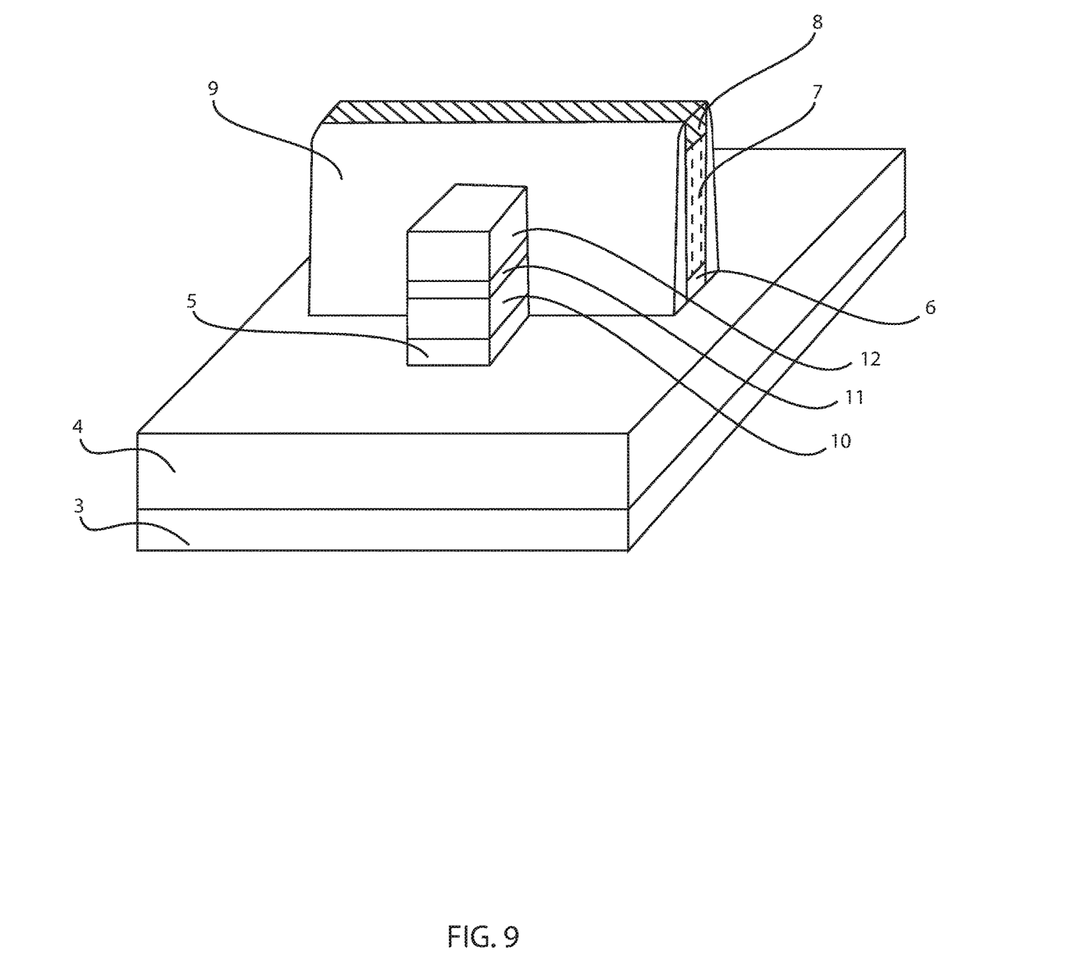
FIG. 9 is a perspective view of the fin field effect transistor (finFET) that is depicted in FIG. 8.

FIG. 9 is a perspective view of the semiconductor device that is depicted in FIG. 8. In one embodiment, the semiconductor device comprises a fin structure 5 including a channel region, and a source region and drain region on opposing sides of the channel region. At least one of the source region and the drain region of the fin structure 5 includes a layered structure 100 including a leakage barrier 11. A gate structure 2 is present on a channel region of the fin structure 5.

Referring to FIGS. 8 and 9, the channel region 13 of the fin structure 5 is composed of a single base material having a height that is coplanar with an upper surface of the layered structure 100 of the source region and the drain region portion of the fin structure 5. In one embodiment, the layered structure 100 includes an n-type conductivity silicon and germanium including layer. i.e., first semiconductor layer 10 having a first conductivity type, that is present on a recessed surface S1 of the fin structure 5; an intrinsic silicon layer, i.e., leakage barrier layer 11, that is present on the n-type conductivity silicon and germanium including layer; and a p-type conductivity silicon and germanium including layer, i.e., second semiconductor layer 12 having a second conductivity type, that is present on the intrinsic silicon layer.

In another embodiment, the leakage barrier layer 11 has an n-type doped portion that is in contact with the n-type conductivity silicon and germanium including layer and the leakage barrier layer has a p-type doped portion that is in contact with the p-type conductivity silicon and germanium including layer.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   etching a source region portion and a drain region portion of the fin structure to provide a recessed surface;
   forming a first semiconductor layer only on the recessed surface of the fin structure that is doped to a first conductivity type;
   forming a leakage barrier layer on the first semiconductor layer, wherein the leakage barrier is only formed on an upper surface of the first semiconductor layer to provide a horizontally orientated leakage barrier layer having a larger band gap than the first semiconductor layer; and
   forming a second semiconductor layer on the leakage barrier layer, wherein the second semiconductor layer is doped to a second conductivity type.

2. The method of claim 1, wherein forming the gate structure comprises:
   forming a gate stack by depositing at least one gate dielectric layer on at least a channel region portion of the fin structure, depositing at least one gate conductor layer on the gate dielectric layer, and depositing a gate cap on the at least one gate conductor layer;
   etching the gate stack so that a remaining portion of the gate stack is present around a channel region of the fin structure; and forming gate sidewall spacer on the remaining portion of the gate stack.

3. The method of claim 1, wherein forming the gate structure comprises a gate first process flow or a gate last process flow.

4. The method of claim 1, wherein the etching of the source region portion and the drain region portion of the fin structure to provide the recessed surface comprises an anisotropic etch that is selective to the gate structure, wherein the recessed surface is vertically offset from a surface of the channel region that the gate structure is present around.

5. The method of claim 1, wherein the forming of the first semiconductor layer on the recessed surface of the fin structure that is doped to a first conductivity type comprises epitaxial deposition of the first semiconductor layer on the recessed surface of the fin structure, wherein the first semiconductor layer is silicon germanium and the first conductivity type is an n-type conductivity.

6. The method of claim 1, wherein the forming of the leakage barrier layer on the first semiconductor layer comprises epitaxial deposition process of an n-type semiconductor material with bandgap larger than the first semiconductor layer.

7. The method of claim 6, wherein the leakage barrier layer comprises silicon.

8. The method of claim 1, wherein the forming of the leakage barrier layer on the first semiconductor layer comprises epitaxial deposition process of a semiconductor material layer having a graded conductivity, wherein a first portion of the leakage barrier layer that is in contact with the first semiconductor layer has a first conductivity and a second portion of the leakage barrier layer that is in contact with the second semiconductor layer has a second conductivity.

9. The method of claim 8, wherein the leakage barrier layer is silicon.

10. A method of forming a semiconductor device comprising:
    etching a source region portion and a drain region portion of the fin structure to provide a recessed surface;
    forming a first semiconductor layer on the recessed surface of the fin structure that is doped to a first conductivity type;
    forming a leakage barrier layer on the first semiconductor layer the leakage barrier having a larger band gap than the first semiconductor layer, wherein the leakage barrier layer is substantially horizontal and does not extend along a majority of a sidewall of the fin structure that extends to the recessed surface; and
    forming a second semiconductor layer on the leakage barrier layer, wherein the second semiconductor layer is doped to a second conductivity type, wherein the leakage barrier layer is comprised of a material having a band gap greater than the first semiconductor layer and the second semiconductor layer, wherein the first semiconductor layer is silicon germanium and the second conductivity type is a p-type conductivity.

11. The method of claim 10, wherein at least one of the leakage barrier layer is comprised of an intrinsic semiconductor layer.

12. The method of claim 10, wherein the forming of the first semiconductor layer on the recessed surface of the fin structure that is doped to a first conductivity type comprises epitaxial deposition of the first semiconductor layer on the recessed surface of the fin structure, wherein the first semiconductor layer is silicon germanium and the first conductivity type is an n-type conductivity.

13. The method of claim 10, wherein the forming of the leakage barrier layer on the first semiconductor layer comprises epitaxial deposition of silicon.

14. The method of claim 10, wherein the forming of the second semiconductor layer on the leakage barrier layer comprises epitaxial deposition of the second semiconductor layer on the intrinsic semiconductor layer, wherein the second semiconductor layer is silicon germanium and the second conductivity type is a p-type conductivity.

15. A semiconductor device comprising:
    a fin structure including a channel region portion, and a source region portion and drain region portion on opposing sides of the channel region portion, wherein a least one of the source region and the drain region includes a recessed surface relative to an upper surface of the channel region portion;
    a horizontally layered structure comprising doped semiconductor layers and including a leakage barrier layer of intrinsic semiconductor between the doped semiconductor layers is present on the recessed surface of the source region and drain region portions of the fin structure wherein the leakage barrier layer has a larger band gap than the doped semiconductor layers and does not extend along a majority of a sidewall of the fin structure.

16. The semiconductor device of claim 15, wherein the layered structure comprises an n-type conductivity silicon and germanium including layer that is present on the recessed surface of the fin structure, an n-type silicon layer that is present on the n-type conductivity silicon and germanium including layer, and a p-type conductivity silicon and germanium including layer that is present on the n-type silicon layer.

17. The semiconductor device of claim 15, wherein the layered structure comprises:
    an n-type conductivity silicon and germanium including layer that is present between the leakage barrier layer and a recessed surface of the fin structure; and
    a p-type conductivity silicon and germanium including layer that is present on an opposing side of the leakage barrier, wherein the leakage barrier layer has a n-type doped portion that is in contact with the n-type conductivity silicon and germanium including layer and the leakage barrier layer has a p-type doped portion that is in contact with the p-type conductivity silicon and germanium including layer.

18. The semiconductor device of claim 17, wherein the leakage barrier layer is silicon.

19. The semiconductor device of claim 15, wherein the channel region potion of the fin structure is composed of a single base material having a height that is coplanar with an upper surface of the layered structure of the doped semiconductor.

* * * * *